(12) United States Patent
Webster et al.

(10) Patent No.: US 7,696,619 B2
(45) Date of Patent: Apr. 13, 2010

(54) STACK COMBINATION OF PLURAL CHIP PACKAGE UNITS

(75) Inventors: Steven Webster, Taipei Hsien (GB); Ying-Cheng Wu, Taipei Hsien (TW); Chao-Yuan Chan, Taipei Hsien (TW); Shih-Min Lo, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/060,106

(22) Filed: Mar. 31, 2008

(65) Prior Publication Data

US 2009/0166837 A1 Jul. 2, 2009

(30) Foreign Application Priority Data

Dec. 28, 2007  (CN) .................. 2007 1 0203520

(51) Int. Cl.
*H01L 23/488* (2006.01)
(52) U.S. Cl. ............... 257/686; 257/724; 257/E23.004; 257/E23.023
(58) Field of Classification Search ................. 257/686, 257/724, E23.004, E23.023, E23.174, E23.178; 361/761
See application file for complete search history.

(56) References Cited

U.S. PATENT DOCUMENTS 6,153,928 A * 11/2000 Cho ........................... 257/686
2007/0290366 A1 12/2007 Cheng

FOREIGN PATENT DOCUMENTS

CN 1996592 A 7/2007

* cited by examiner

*Primary Examiner*—Lynne A Gurley
*Assistant Examiner*—Vernon P Webb
(74) *Attorney, Agent, or Firm*—Andrew C. Cheng (57) ABSTRACT

A combination includes a first chip package unit and a second chip package unit on which the first chip package unit is placed. Each of the first and second chip package units includes a substrate having a first surface, a second surface, a chip package electrically connected to the first surface, and a plurality of bonding pads formed on the first and second surfaces. The bonding pads on the first surface of the first chip package unit are respectively electrically connected with the bonding pads on the surface of the second chip package unit. The chip packages electrically connected to the first surfaces are enclosed by the substrates, and the bonding pads on the second surfaces are configured as interface terminals of the combination.

6 Claims, 8 Drawing Sheets

STACK COMBINATION OF PLURAL CHIP PACKAGE UNITS

BACKGROUND

1. Technical Field

The present invention relates to chip package units and, particularly, to a combination of chip package units.

2. Description of Related Art

In accordance with the trend of miniaturizing electronic apparatuses, attempts are being made to pack more than one chip into a package for achieving a high density. However, each chip performs a special function, and functions of each package are invariable once assembled.

What is needed, therefore, is a combination of chip package units which overcome the above described problem.

SUMMARY

In accordance with an exemplary embodiment, a combination includes a first chip package unit placed on a second chip package unit. Each of the first and second chip package units includes a substrate having a first surface, a second surface, a chip package electrically connected to the first surface, and a plurality of bonding pads formed on the first and second surfaces. The bonding pads on the first surface of the first chip package unit are respectively electrically connected with the bonding pads on the surface of the second chip package unit. The chip packages electrically connected to the first surfaces are enclosed by the substrates, the bonding pads on the second surfaces are configured as interface terminals of the combination.

Other advantages and novel features will be drawn from the following detailed description of at least one preferred embodiment, when considered in conjunction with the attached drawings.

BRIEF DESCRIPTION OF THE DRAWINGS

Many aspects of the present combination of chip package units can be better understood with reference to the following drawings. The components in the drawings are not necessarily drawn to scale, the emphasis instead being placed upon clearly illustrating the principles of the present combination of chip package units. Moreover, in the drawings, like reference numerals designate corresponding parts throughout the several views.

(2)

DETAILED DESCRIPTION OF THE EMBODIMENTS

Embodiments of the present combination of chip package units will now be described in detail below and with reference to the drawings.

Figure 1:
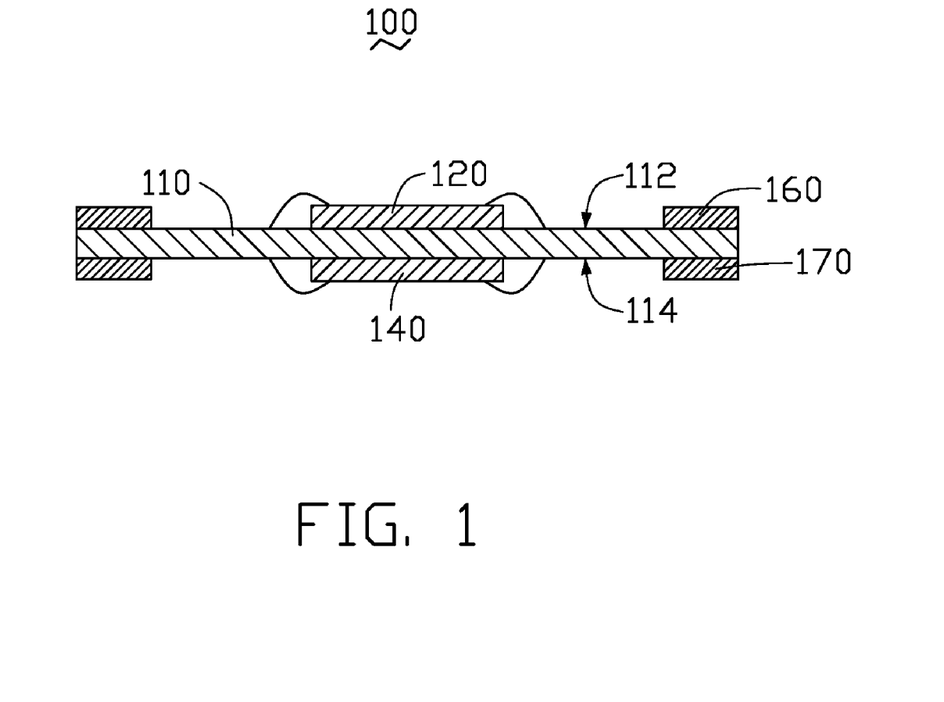
FIG. 1 is a schematic, cross-sectional view of a chip package unit, according to an exemplary embodiment.

Referring to FIG. 1, a chip package unit 100 is illustrated. The chip package unit 100 comprises a substrate 110, two chip packages 120, 140, and a plurality of bonding pads 160, 170. The substrate 110 is flattened, and defines a top surface 112 with the chip package 120 electrically connected thereto, and a bottom surface 114 with the chip package 140 electrically connected thereto. The bonding pads 160 are formed on the top surface 112, and surround the chip package 120. The bonding pads 170 are formed on the bottom surface 114, and surround the chip package 140. In the embodiment, the chip packages 120, 140 are set at a central portion of the top and bottom surfaces 112, 114 respectively, and coaxially aligned with each other. The bonding pads 160, 170 are set near outer edges of the substrate 110, and aligned with each other respectively.

Figure 2:
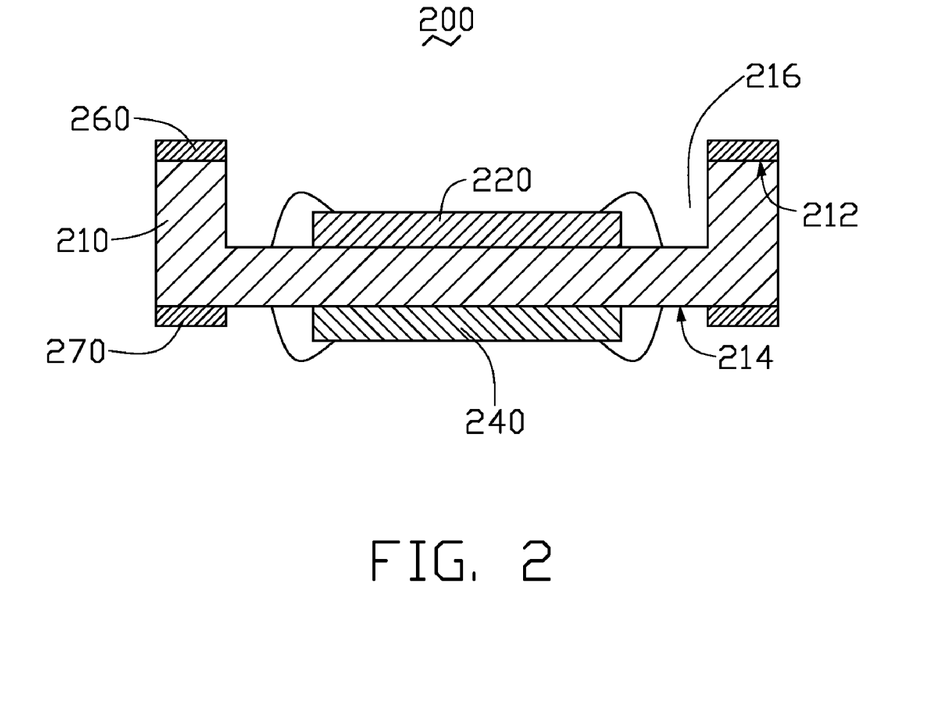
FIG. 2 is a schematic, cross-sectional view of another chip package unit, according to the exemplary embodiment.

Referring to FIG. 2, a chip package unit 200 is illustrated. The chip package unit 200 comprises a substrate 210, two chip packages 220, 240, and a plurality of bonding pads 260, 270. The substrate 210 defines a top surface 212, a bottom surface 214, and a central recessed portion 216 defined in the top surface 212. The chip package 220 is received in the recessed portion 216, and the chip package 240 is electrically connected to the bottom surface 214 and aligned with the chip package 220. The bonding pads 260 are formed at the top surface 212. The bonding pads 270 are formed on the bottom surface 214, and surround the chip package 240 and are aligned with the bonding pads 260. In the embodiment, the recessed portion 216 is centered at the top surface 212.

Figure 3:
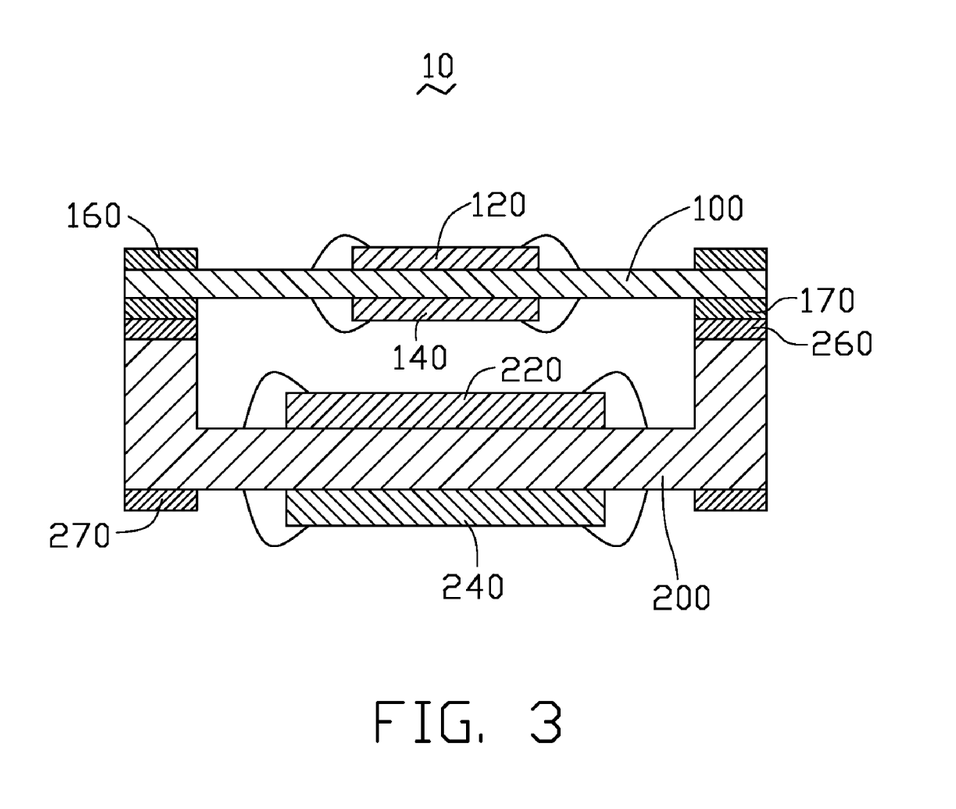
FIG. 3 is a schematic, cross-sectional view of a combination of the chip package unit of FIG. 1 and the chip package unit of FIG. 2.

Referring to FIG. 3, a combination 10 is illustrated. The combination 10 comprises one chip package unit 100, and one chip package unit 200. The chip package unit 100 is placed on the top side of the chip package unit 200, with the bonding pads 170 correspondingly electrically connected to the bonding pads 260. The chip packages 140, 220 are enclosed by the chip package units 100, 200 respectively, and the chip packages 120, 240 are disposed at opposite sides of the combination 10. The bonding pads 160, 270 are configured as interface terminals of the combination 10 to electrically connect the chip package units 100, 200 to other components, such as additional chip package units 100, 200.

Figure 4:
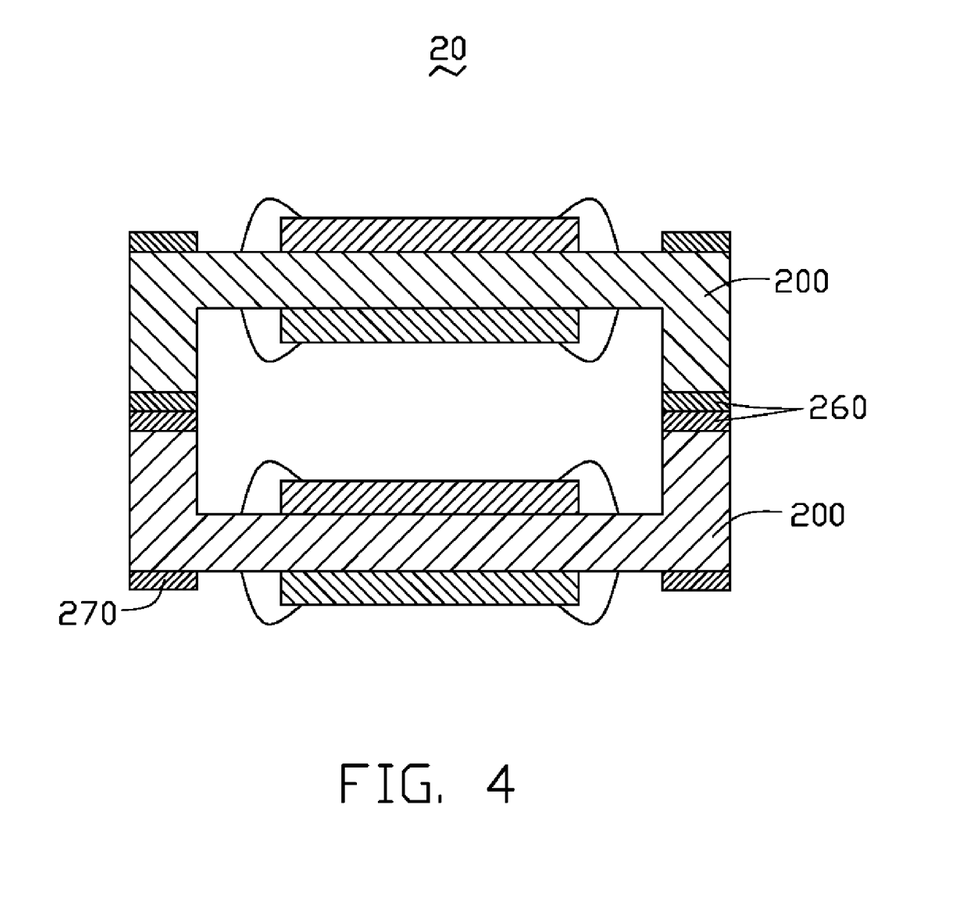
FIG. 4 is a schematic, cross-sectional view of a combination of two chip package units of FIG. 2.

Referring to FIG. 4, a combination 20 is illustrated. The combination 20 is similar to the combination 10; however, the first chip package is designated as another chip package unit 200, which is a mirror of the second chip package unit. The bonding pads 260 of the two chip package units 200 are correspondingly electrically connected together. In the combination 20, the bonding pads 270 are configured as interface terminals of the combination 20 to electrically connect the chip package units 200 to other components, respectively.

Figure 5:
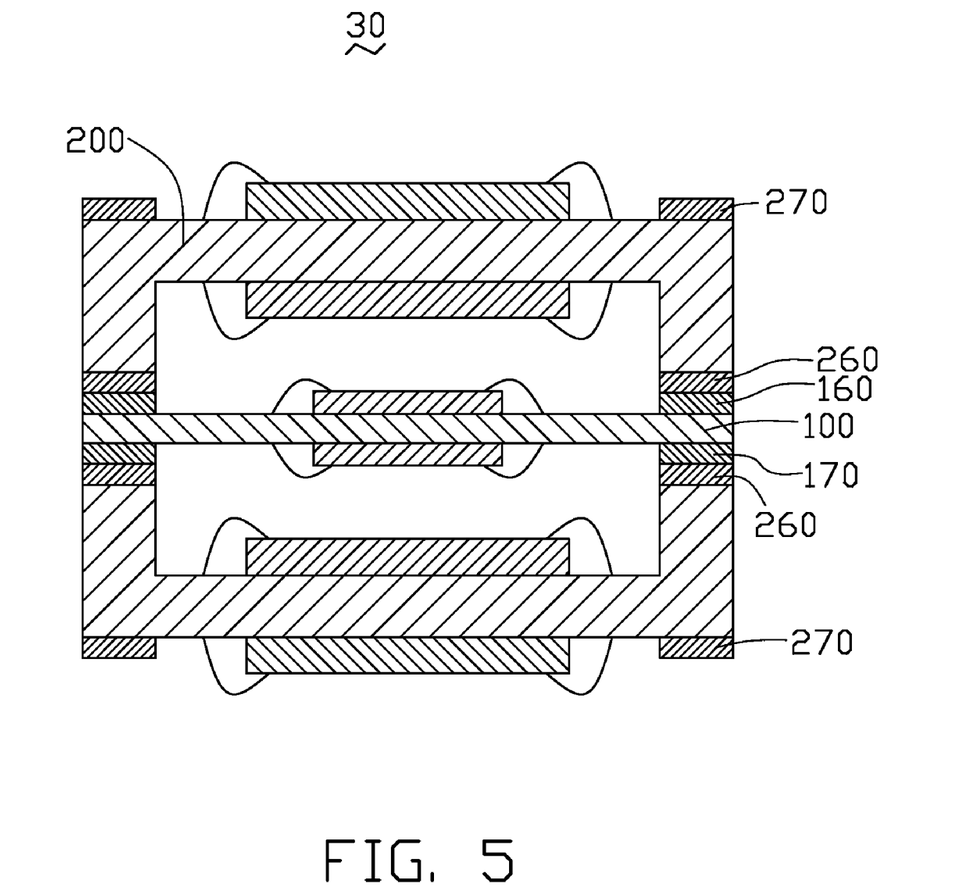
FIG. 5 is a schematic, cross-sectional view of a combination of one chip package unit of FIG. 1 and two chip package units of FIG. 2.

Referring to FIG. 5, a combination 30 is illustrated. The combination 30 is similar to the combination 10, but comprising an additional chip package unit 200. The two chip package units 200 face each other with the chip package unit 100 disposed between them. In the combination 30, the bonding pads 260 of one chip package unit 200 are electrically connected with the bonding pads 160, and the bonding pads 260 of the other chip package unit 200 are electrically connected with the bonding pads 170. The bonding pads 270 are configured as interface terminals of the combination 10 to electrically connect the chip package units 200 to other components, respectively.

Figure 6:
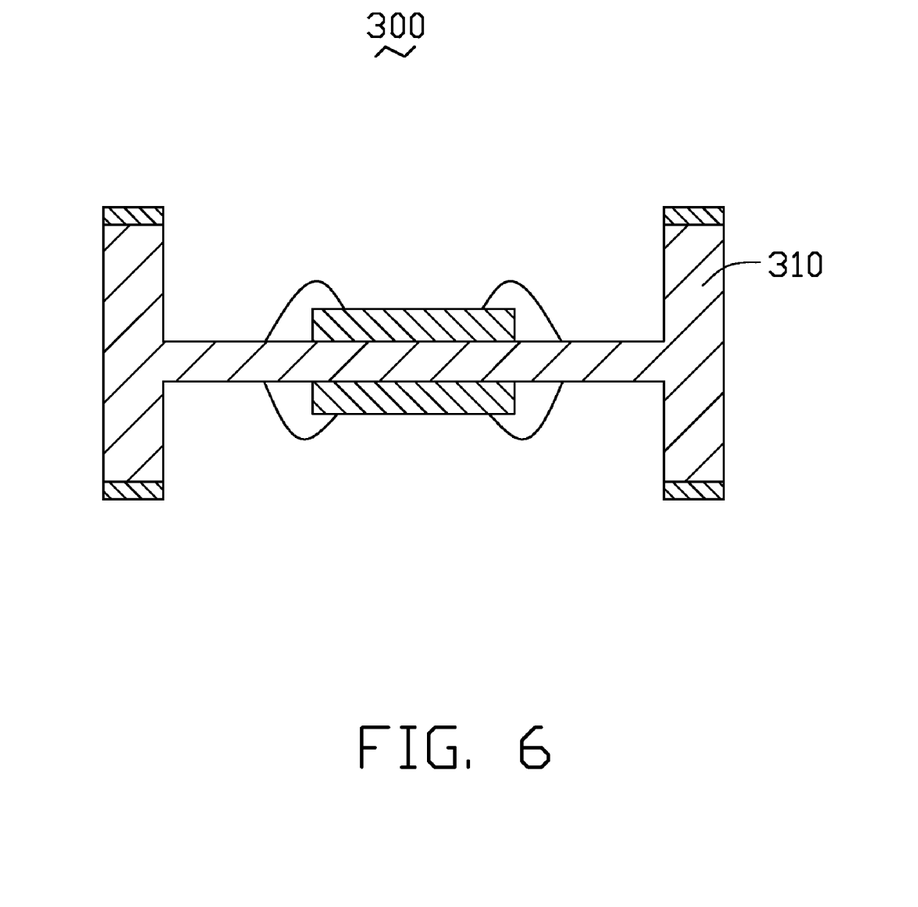
FIGS. 6-8 are schematic, cross-sectional views of alternative chip package units which can be assembled with each other and with the chip package units as shown in FIGS. 1-2.
Figure 7:
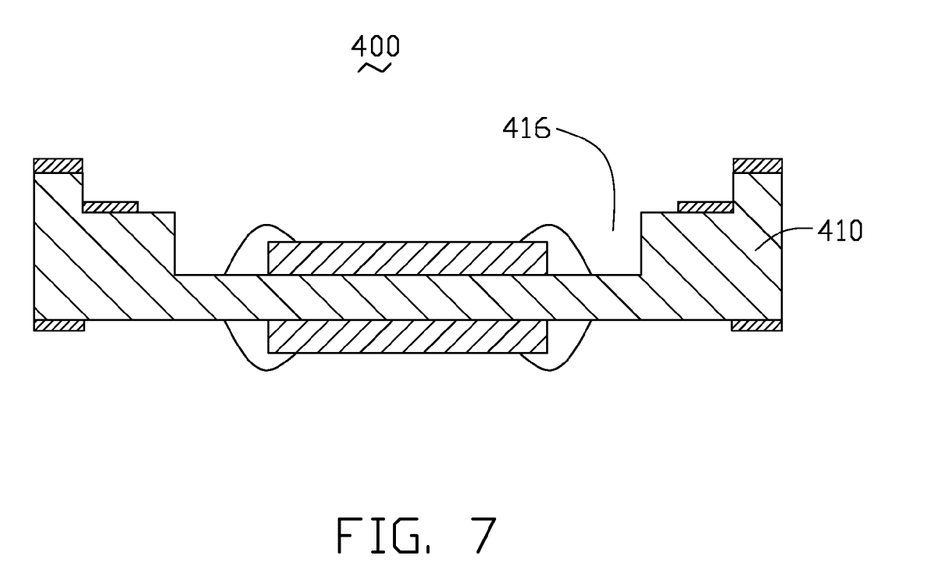
Figure 8:
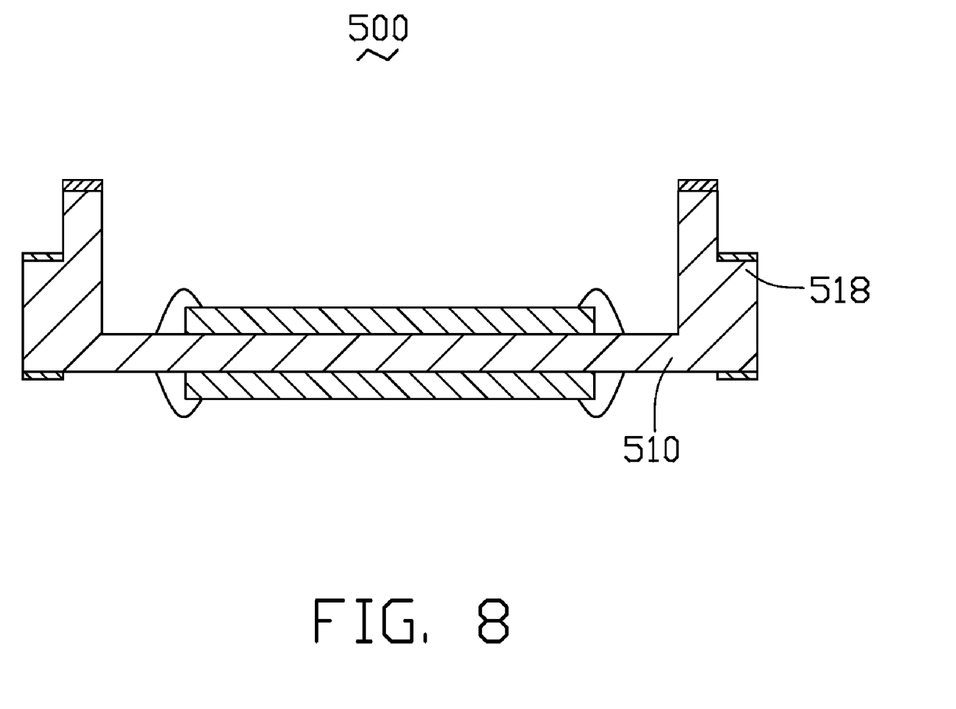

Other chip package units 300, 400, 500 are illustrated in FIGS. 6-8, respectively. As shown in FIG. 6, the chip package unit 300 is similar to the chip package unit 200, but comprises a substrate 310 having an H-shaped configuration. As shown in FIG. 7, the chip package unit 400 is similar to the chip package unit 200, but the substrate 410 of the chip package unit 400 is stepped at the recessed portion 416. As shown in FIG. 8, the chip package unit 500 is similar to the chip package unit 400, but comprises a substrate 510 having outer steps 518. The chip package units 300, 400, 500 can be combined with each other and with the chip package units 100, 200 to form various combinations in accordance with actual requirements.

It will be understood that the above particular embodiments and methods are shown and described by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. A combination comprising:
   a first chip package unit stacked on a second chip package unit, each of the first and second chip package units comprising:
   a substrate having a first surface, a second surface, a chip package electrically connected to the first surface, and a plurality of bonding pads formed on the first and second surfaces,
   wherein a center of the first surface of the substrate of the first chip package unit defines a stepped recess portion, such that the substrate of the first chip package unit comprises a horizontal main body and two opposite side walls extending perpendicularly from the main body, with each of the side walls defining an outer high portion and an inner low step, the chip package of the first chip package unit being received between the inner low steps, and the bonding pads of the first surface of the substrate of the first chip package unit being located on the outer high portions and the inner low steps,
   the substrate of the second chip package unit comprises a horizontal main body and two opposite side walls extending perpendicularly from the main body, each of the side walls defines an inner high portion and an outer low step, and the bonding pads of the first surface of the substrate of the second chip package unit are located on the inner high portions and the outer low steps,
   the bonding pads on the first surface of the first chip package unit are respectively electrically connected with the bonding pads on the first surface of the second chip package unit, with the bonding pads of the outer high portions of the first surface of the substrate of the first chip package unit being electrically connected with the bonding pads of the outer low steps of the first surface of the substrate of the second chip package unit, and the bonding pads of the inner low steps of the first surface of the substrate of the first chip package unit being electrically connected with the bonding pads of the inner high portions of the first surface of the substrate of the second chip package unit, and
   the chip packages electrically connected to the first surfaces are enclosed by the substrates, and the bonding pads on the second surfaces of the substrates of the first and second chip package units are configured as interface terminals of the combination.

2. The combination as claimed in claim 1, wherein the bonding pads on the first surfaces surround the chip packages respectively.

3. The combination as claimed in claim 1, wherein an additional chip package unit is electrically connected on the second surface of the substrate of the first chip package unit.

4. The combination as claimed in claim 3, wherein the first chip package unit comprises an additional chip package on the second surface thereof.

5. The combination as claimed in claim 4, wherein the chip packages on the first chip package unit are centrally set.

6. The combination as claimed in claim 1, wherein the first chip package unit comprises an additional chip package on the second surface thereof, and the second chip package unit comprises an additional chip package on the second surface thereof.

* * * * *